(12) United States Patent
Tatschl-Unterberger et al.

(10) Patent No.: US 7,808,328 B2
(45) Date of Patent: Oct. 5, 2010

(54) RING OSCILLATOR WITH CONSTANT GAIN

(75) Inventors: Eva Tatschl-Unterberger, Villach (AT); Nicola DaDalt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 61 days.

(21) Appl. No.: 11/948,070

(22) Filed: Nov. 30, 2007

(65) Prior Publication Data
US 2009/0140820 A1 Jun. 4, 2009

(51) Int. Cl.
*H03K 3/03* (2006.01)

(52) U.S. Cl. .............................. 331/57; 331/179; 331/56

(58) Field of Classification Search ................... 331/57, 331/179, 47, 56, 34
See application file for complete search history.

(56) References Cited

U.S. PATENT DOCUMENTS

| | | | |
|---|---|---|---|
| 6,204,694 B1 * | 3/2001 | Sunter et al. | 326/93 |
| 6,507,247 B2 * | 1/2003 | Langston | 331/47 |
| 7,449,961 B2 * | 11/2008 | Sai et al. | 331/2 |

* cited by examiner

*Primary Examiner*—Robert Pascal
*Assistant Examiner*—Ray Johnson
(74) *Attorney, Agent, or Firm*—Lee & Hayes, PLLC

(57) ABSTRACT

This disclosure relates to delay cells in a ring oscillator that include sub-cells having a gain that is a function of a variable control signal and sub-cells with a gain that is set by a fixed control signal.

20 Claims, 7 Drawing Sheets

RING OSCILLATOR WITH CONSTANT GAIN

BACKGROUND

This application relates to a ring oscillator structures, and more specifically to ring oscillators having controllable gain and output frequencies.

Low-complexity large-tuning range ring oscillators generally have high frequency gain. The availability of a high frequency clock having low jitter is of fundamental importance for the operation of integrated circuits containing building blocks like Analog to Digital Converters, Digital to Analog converters, Serial Interfaces, and wireless or wireline transceivers. A well known solution for the generation of high frequency clocks is the use of a Phase Locked Loop (PLL) circuit, that locks the frequency of a high-frequency oscillator (called a Controlled Oscillator, or "CO") to a multiple (integer or non-integer) of a reference frequency. The frequency of a CO is tuned using a tuning signal.

A large number of applications require the high-frequency clock to be tunable over a broad frequency range, which could span, for instance, from a few hundred MHz to 10 GHz. Since the PLL might be included in big digital cores, or placed near building blocks which generate disturbances on a power supply, it is important that the CO has low frequency gain (Kco). The frequency gain is defined as $\Delta F/\Delta c$, where $\Delta c$ is the variation of the tuning signal and $\Delta F$ is the corresponding change in output frequency. Indeed the lower the Kco, the smaller the effect of disturbances or noise on the tuning signal or on the jitter of the clock output.

In many applications, it is customary to use a ring oscillator as the CO. The structure of a ring oscillator is basically a chain of delay cells where the output is fed back to the input. If the Barkhausen criterion is satisfied, this structure will oscillate, generating a clock signal. The frequency can be tuned by changing the delay of each delay cell by using either analog or digital tuning signals.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein is a ring oscillator structure and techniques for setting the output frequency of the ring oscillator.

Figure 1:
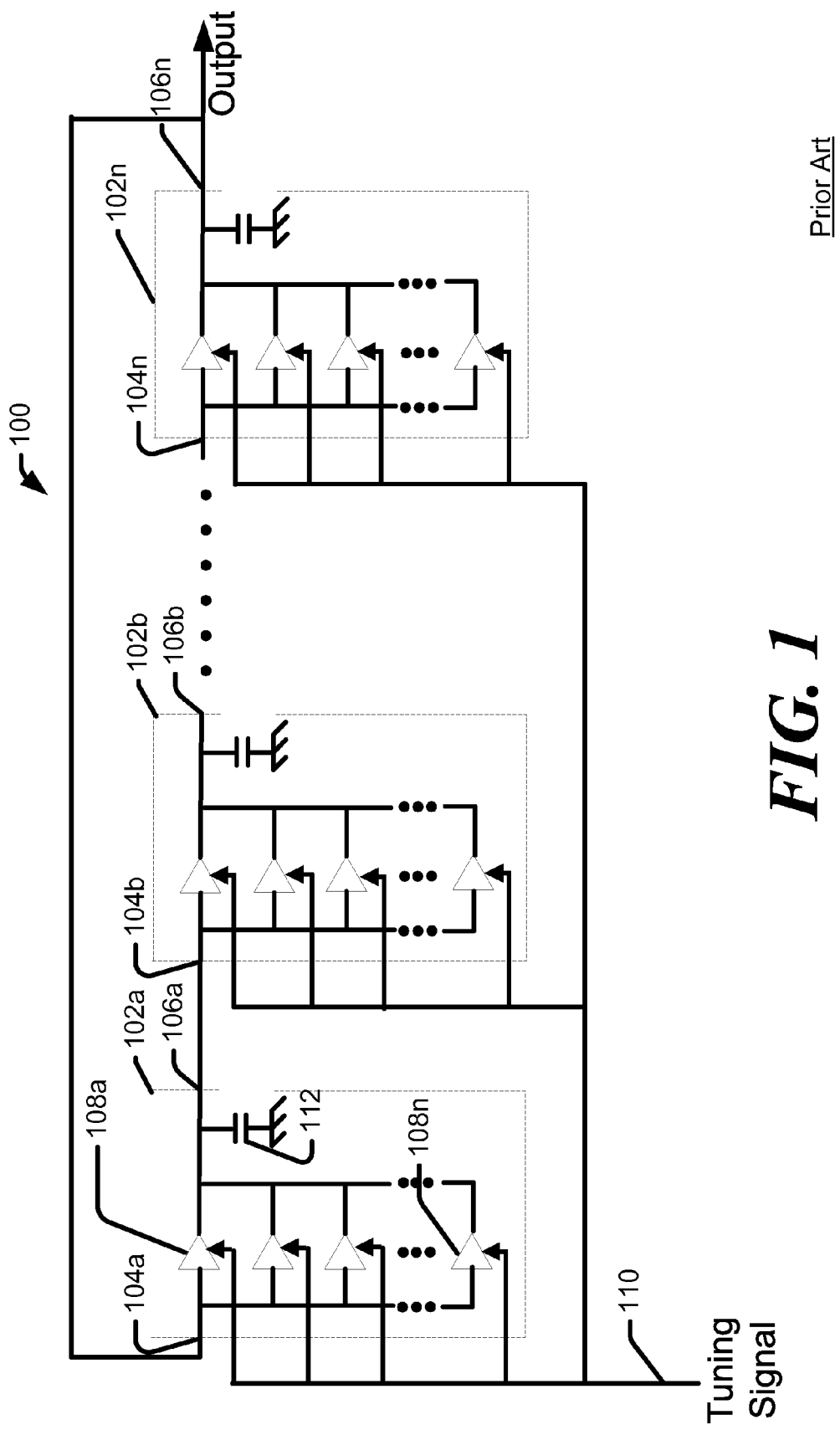
FIG. 1 is simplified schematic diagram of a prior art Ring Oscillator.

A prior art ring oscillator 100 is illustrated in FIG. 1. Ring oscillator 100 has an output, and a number of cascaded delay cells 102a-102n. Each of cells 102a-102n respectively having an input terminal 104a-104n and an output terminal 106a-n. The input terminal, e.g., 104b, of one cell, e.g., 102b, is connected to the output terminal, e.g., 106a, of the proceeding cell, e.g., cell 102a. However, the input terminal 104a of the first cell 102a is connected to the output terminal 106n of the last cell 102n. Disposed within each of cells 102a-102n are delay sub-cells 108a-108n. Sub-cells 108a-108n each have common inputs respectively connected to input terminals 104a-n, and a common output respectively connected to output terminals 106a-n. In one implementation, a capacitor, such as capacitor 112, may be connected to the common output.

The delay of each of sub-cells 108a-n is controlled by a common tuning signal (e.g. an analog voltage or current level) supplied by a control circuit (not shown) on line 110. In one implementation, any of the sub-cells 108a-108n may be turned off by putting a delay sub-cell 108a-108n into a power down state (e.g. by deactivating the sub-cell). When power is applied to ring oscillator 100, the ring oscillator generates a clock signal on its output having a frequency that varies with the control signal of the common tuning signal and the number of sub-cells powered on.

Figure 2A:
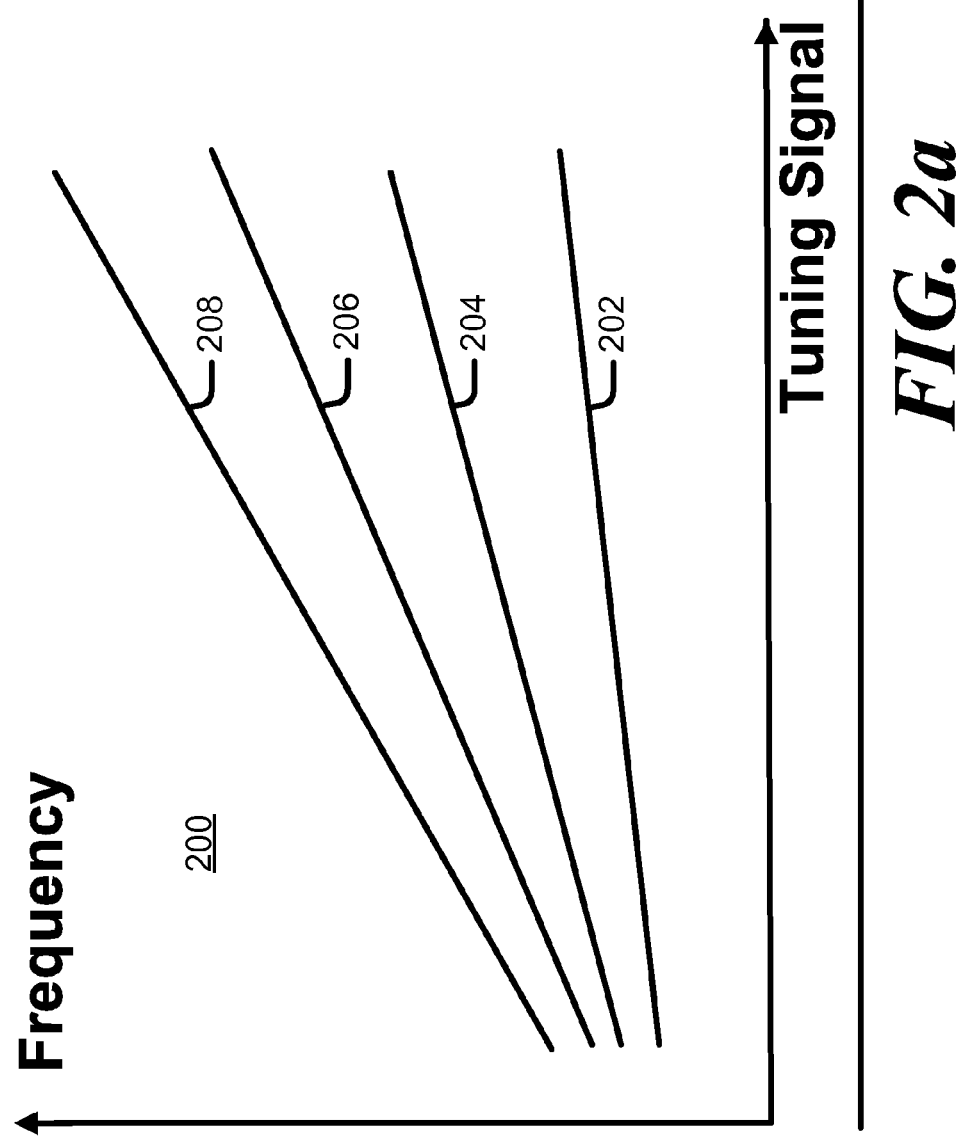
FIGS. 2a and 2b are turning curves for the Ring Oscillator displayed in FIG. 1.

FIG. 2a shows a graph 200a depicting tuning curves 202-208 of the prior art ring oscillator 100 (also referred to herein as a controlled ring oscillator) with an output frequency that varies as a function of the voltage of the tuning signal and the number of sub-cells that are powered on. In one embodiment, one of the sub-cells (e.g. sub-cell 108a) in each of the cells 102a-102n is powered on, while all the other sub cells are powered off. The frequency of the output of the controlled ring oscillator 100 is shown by curve 202. Curves 204, 206 and 208 depict the frequency of the output of controlled ring oscillator 100 as a function of the tuning signal as more sub-cells 108a-n are powered on. In one implementation, curve 208 illustrates the frequency of the output of the controlled ring oscillator 100 as the tuning signal changes when all the sub-cells 108a-n are powered on. The frequency of the output of the controlled ring oscillator 100 as a function of the tuning signal increases at a greater rate when more sub-cells are powered on. The ring oscillator 100 depicts a much higher Kco in curve 208 than curve 202. Variable gain excites stress on the control circuit as the control circuit has to accommodate for all cases of gain resulting in suboptimal dimensioning of the ring oscillator when used in a phase lock loop.

Figure 2B:
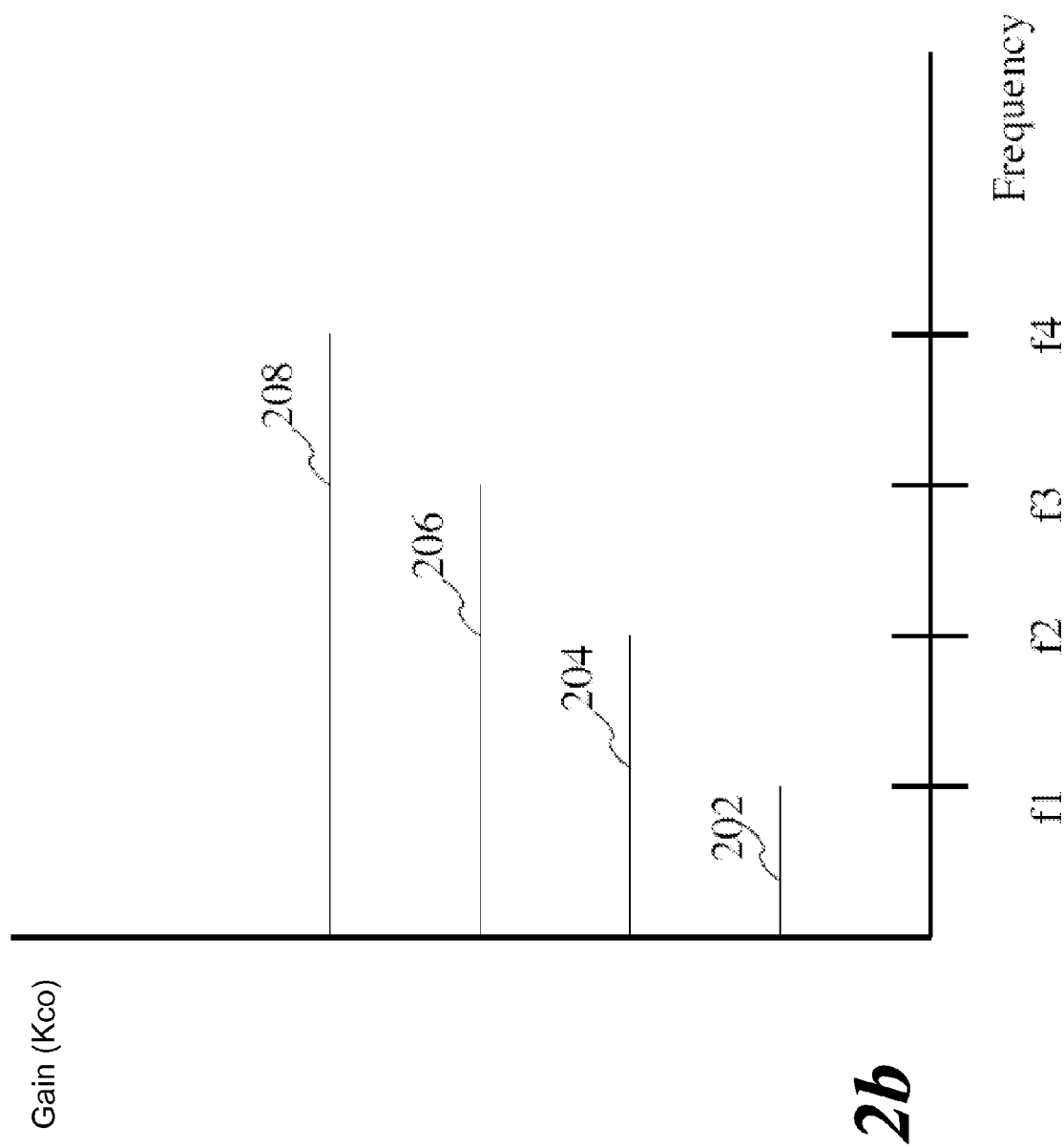

FIG. 2b shows a graph 200b depicting the tuning curves 202-208 of ring oscillator 100, where the x axis is the oscillator frequency and the y axis is the gain of the controlled or ring oscillator (Kco). Graph 200b illustrates that frequencies between frequency 0 and f1 can be reached by biasing the ring oscillator with the levels on any of the curves. Graph 200b illustrates that frequencies between frequency f1 and f2 can only be reached by biasing the ring oscillator with the levels on curves 204-208, that frequencies between frequency f2 and f3 can be reached by biasing the ring oscillator with levels on the curves 206 and 208 and that frequencies above frequency f3 can reached by biasing the ring oscillator with levels on curve 208.

In one implementation, the ring oscillator 100 includes a number of cascaded delay cells that are controlled by a variable control signal generated by a control circuit. Each delay cell has an input connected to receive an input signal which, except for the first of the cascaded delay cells, corresponds to an output signal derived from a preceding delay cell. The input of the first delay cell is connected to receive the output signal of the last delay cell. At least one of the delay cells is constituted by sub-cells. Any of sub-cells may be powered off. One of the sub-cells that is powered on has a gain or delay that is variable as a function of a variable control signal. The remaining sub-cells that are powered on have a gain and/or delay that is set by a fixed control signal.

According to another implementation, a method is provided for generating an oscillating output signal having a tunable frequency. A number of delay cells are cascaded such that an input signal is supplied to an input of each delay cell which, except for the first of the cascaded delay cells is provided from an output signal derived from the preceding delay cells. The output signal of the last delay cell is supplied to the input of the first delay cell. A delay of the delay cells is controlled with a variable control signal and a fixed control signal that are respectively connected to sub-cells within the delay cell. The frequency of the oscillating output signal is set by setting a delay of the sub-cells that are powered on in each of the cascaded delay cells to be variable as a function of the variable control signal, and the delay of the rest of the sub-cells that is powered on is set by the fixed control signal. Also in an implementation there may be not be a fixed control signal. For example, when one sub-cell is powered on, it will receive a variable control signal, when two sub-cells are powered on, one sub-cell is controlled by the variable and one by the fixed control signal. When three sub-cells are powered on, one sub-cells is fed the variable control signal and two are fed the fixed control signal.

The techniques described herein may be implemented in a number of ways. One example environment and context is provided below with reference to the included figures and on going discussion.

Exemplary Systems

Figure 3:
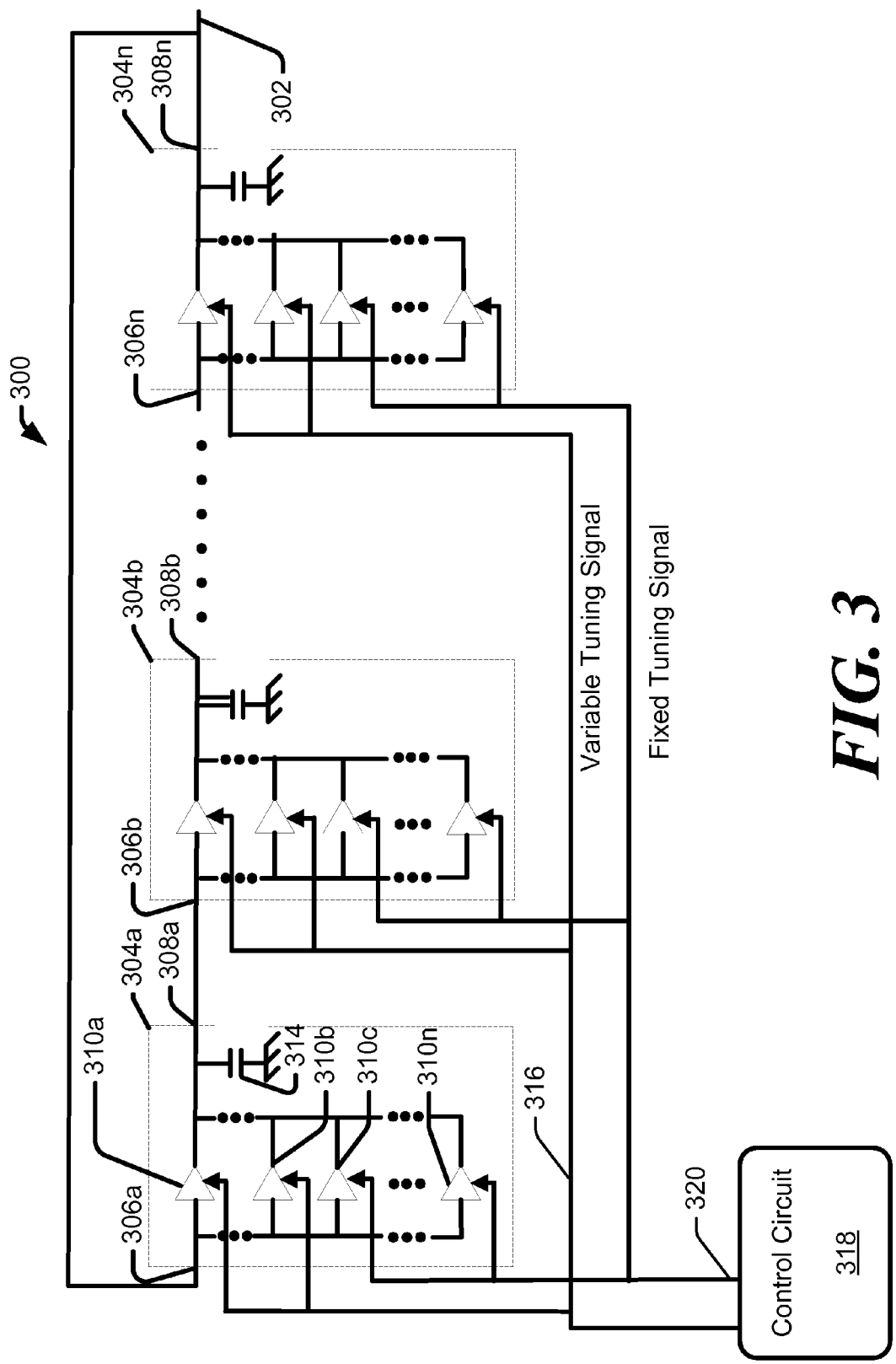
FIG. 3 is simplified schematic diagram of a Ring oscillator coupled with a control circuit.

FIG. 3 illustrates one implementation of a ring oscillator 300 in accordance with a one embodiment of the claimed invention. Ring oscillator 300 has an output on output terminal 302, and a number of cascaded delay cells 304a-304n. Each of delay cells 304a-304n respectively have an input terminal 306a-306n and an output terminal 308a-n. The input terminal (e.g. 306b) of each of cells is connected to the output terminal (e.g. 308a) of the preceding cell. However, the input terminal 306a of the first cell 304a is connected to the output terminal 308n of the last cell 304n. Disposed within each of cells 304a-304n are delay sub-cells 310a-310n. Sub-cells 310a-310n are connecting in parallel with each sub-cell having a common input respectively connected to input terminals 306a-306n, and having a common output respectively connected to output terminals 308a-308n. In one implementation, a capacitor, such as capacitors 314, may be connected to the common output.

The delay of some of sub-cells, e.g. 310a-310b, is controlled by a common variable tuning signal (e.g. a variable analog or digital signal, also referred to herein as a variable control signal) on control line 316 supplied by a control circuit 318. In one embodiment, the delay of other sub-cells, e.g. 310c-310n, is controlled by a common fixed tuning signal (e.g. a fixed analog voltage level, fixed digital pattern or current level, also referred to herein as a fixed control signal) on control line 320 which is supplied by the control circuit 318. In another implementation, control circuit 318 may include a processor and a memory that contains instructions. Using generally known techniques, the control circuit 318 may generate analog control signals using a digital to analog converter (not shown) or generate digital control signals. In another implementation, the control circuit 318 may be included in a phase lock loop circuit that generates a tuning signal to cause the output frequency of the control ring oscillator 300 to be locked to a supplied clock signal (not shown). Control circuit can activate and deactivate sub-cells to increase or decrease the minimum frequency and maximum frequency of a range in which the frequency of the output signal of the ring oscillator 300 changes as a function of the variable control signal.

In another embodiment, the voltage or current levels of a digital control word of the fixed tuning signal are preset or digital controllable. The levels are directly supplied into the control ring oscillator 300. In another implementation, using generally known techniques, any of the sub-cells 310a-310n may be turned off by disconnecting the sub-cell 310a-310n from their power supplies. Powering the sub-cells connected to the fixed tuning signal on and off changes a frequency offset of the output of the ring oscillator 300. When power is applied to ring oscillator 300, the ring oscillator 300 generates a clock signal on its output terminal 302 having a frequency that varies with the voltage level, current level or digital control word of the variable tuning signal and the number of stages having variable or fixed tuning.

Each sub-cell (310a-310n) in each of cells 304a-304n, may be constructed using generally known techniques, such as using single ended or differential structures. Although a cell comprised of four sub cells are shown, this implementation is meant to serve only as a non-limiting example and any number of sub-cells or any number of cells may be used in the implementation.

Figure 4A:
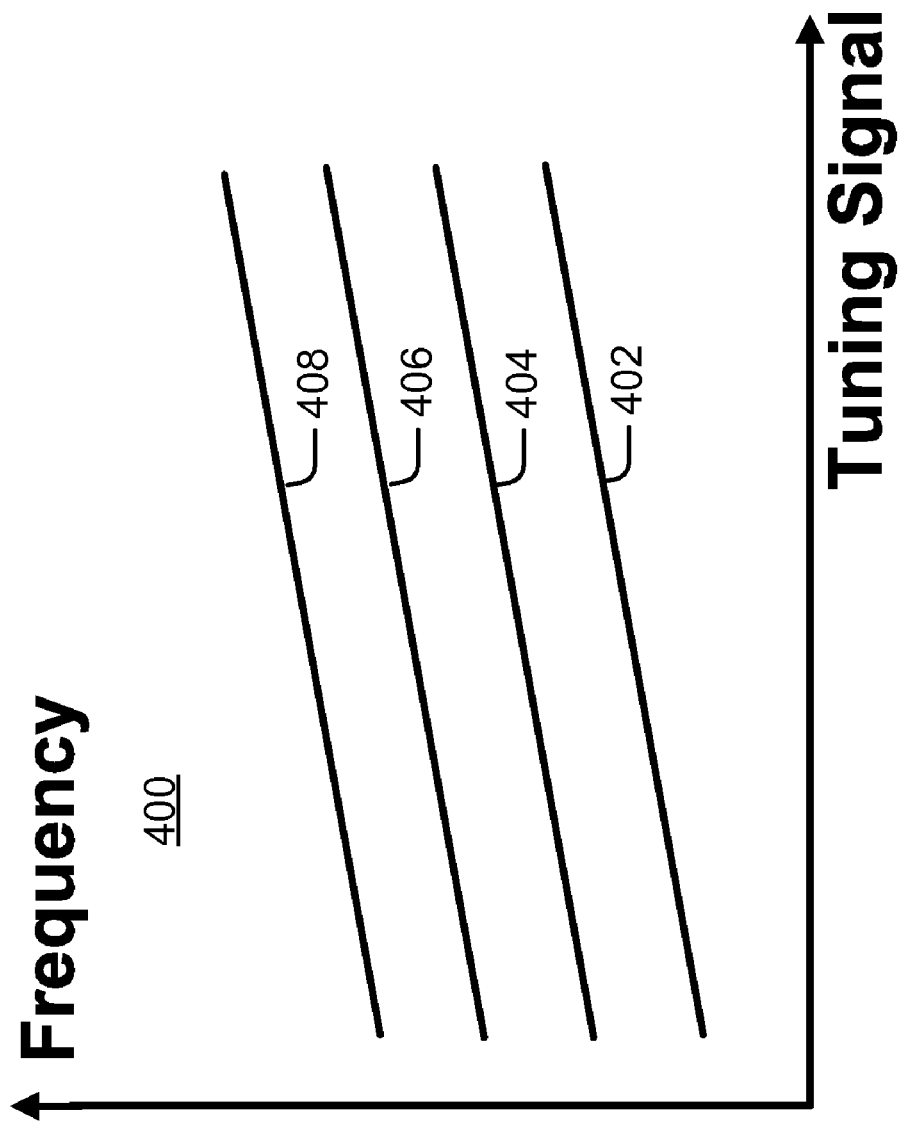
FIGS. 4a and 4b are turning curves for the Ring Oscillator displayed in FIG. 3.

FIG. 4a shows a graph 400 depicting tuning curves 402-408 of the ring oscillator 300, where the x axis is the level of the tuning signal and the y axis is the ring oscillators frequency. These curves illustrate an output frequency that varies as a function of the voltage of the variable tuning signal and a number of sub-cells that receive power.

In one embodiment, one of the sub-cells (e.g. sub cell 310a) in each of the cells 304a-304n is powered on, while some of the other sub-cells are powered off and of the rest of the sub-cells receive a fixed tuning signal. The frequency of the output of the controlled oscillator 300 as a function of the variable tuning signal supplied on line 316 is shown by curve 402. Curves 404, 406 and 408 depict the frequency of the output of controlled oscillator 302 as a function of the variable tuning signal as more sub-cells 310a-310n are powered on and fed the fixed tuning signal.

In one implementation, curve 408 illustrates the frequency of the output of the controlled oscillator 300 as the variable tuning signal changes, such as when all of the sub-cells 310a-310n are powered on and some of the sub-cells receive a fixed tuning signal. Because some of the sub-cells in the cell are supplied a fixed control signal, and the number of cells receiving a variable tuning signal stays constant, the frequency of the output of the ring oscillator as a function of the variable tuning signal increases at substantially the same rate regardless of the number of sub-cells that are powered on.

Figure 4B:
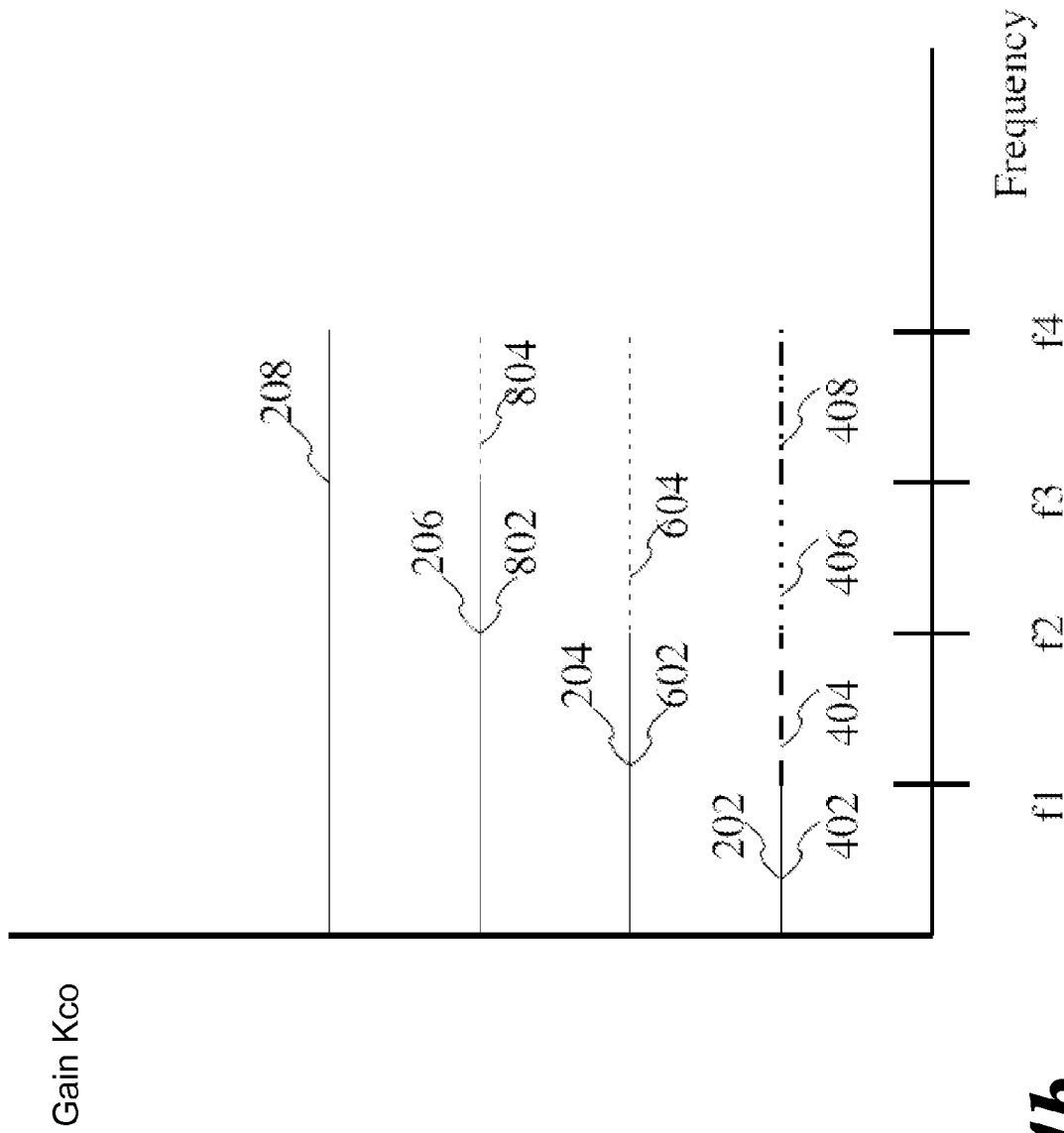

FIG. 4b shows the gain of the ring oscillator as a function of frequency, where the x axis is the output frequency and the y axis is the gain or Kco of the oscillator for any given input level. Input levels 202-208 are the input levels depicted in FIG. 2b. Specifically the gain of ring oscillator 300 is constant for all input levels 402 to 408. This is desirable for all ring oscillators since it relaxes the requirements for the control circuit (e.g. in a PLL) and leads to leaner and more effective designs.

Since the number of stages to be chosen to be used with variable gain, fixed gain or in power down is completely variable, a number of additional tuning curves can be generated. FIG. 4a shows an example for curves 602, 604 and 802 in ring oscillators having two stages variable or three stages variable tuned where the rest or the stages has fixed tuning or is powered down. FIG. 4b depicts that in ring oscillator 300 the entire space of gain Kco can be reached for any desired frequency.

Exemplary Process

Figure 5:
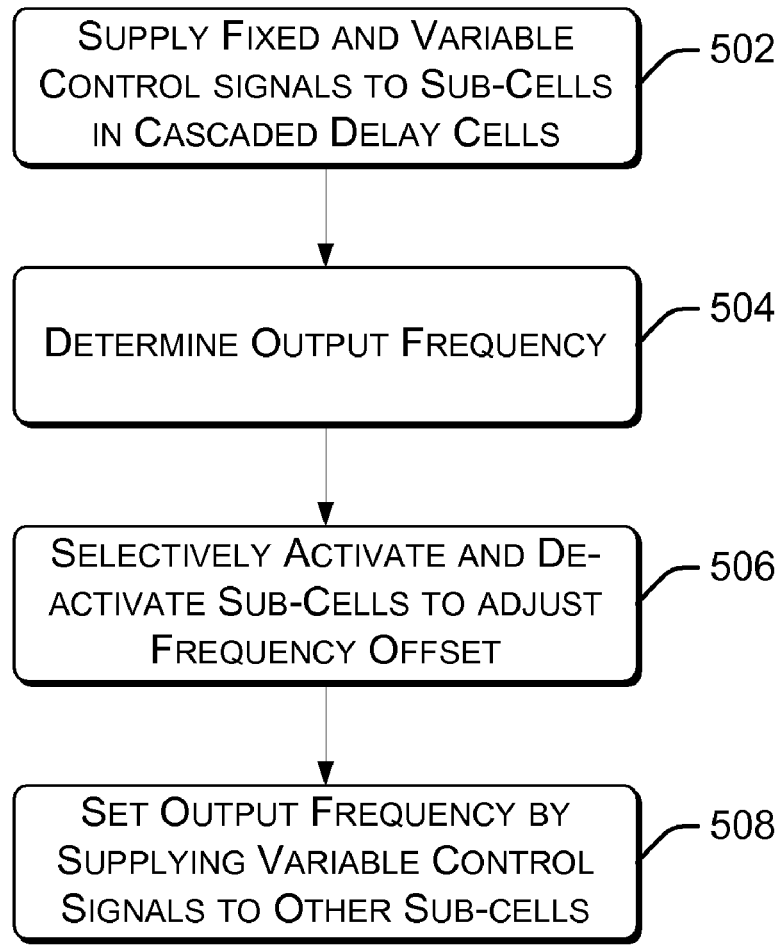
FIG. 5 is a flow diagram of a technique for setting an output frequency of a ring oscillator, such as the ring oscillator displayed in FIG. 3.

FIG. 5 shows one example implementation of a process 500 for tuning the ring oscillator, such as the ring oscillator 300 illustrated in FIG. 3.

At block 502, fixed control signals are selectively supplied on line 320 to sub-cells (e.g. sub cells 306c, 306d) in each of cascaded cells 302a-302n or ring oscillator 300. These fixed control signals sets the gain and delay of the sub-cells to which they are supplied (e.g. sub-cells 306c, 306d). Also variable control signals are selectively supplied on line 316 to different sub-cells (e.g. sub-cells 306a and 306b) and set the gain and delay of the sub-cells to which they are supplied (e.g. sub-cells 306a, 306b).

At block 504, a determination is made by the control circuit 318 as to the output frequency to be generated by the ring oscillator 300. This determination may be made for example to provide a frequency to lock to a known clock signal in a phase lock loop.

At block 506, the control circuit 318 selectively powers on or off specific sub-cells of cells 304a-304n, to ensure that the desired frequency can be obtained on output terminal 302. This desired frequency is set by changing the variable tuning signal (variable control signal) in according with the tuning curves illustrated in FIG. 4.

At block 508, the level of the variable tuning signal (variable control signal) on line 316 is adjusted so the ring oscillator 300 generates the desired output frequency. This variable control signal may be continuously changed to change the output frequency of the ring oscillator 300.

Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A ring oscillator comprising:
a control circuit to generate a variable control signal and a fixed control signal; and
a number of cascaded delay cells being controlled by the variable control signal, each delay cell having an input connected to receive an input signal which, except for the first of the cascaded delay cells, corresponds to an output signal derived from preceding delay cells, the input of the first delay cell being connected to receive the output signal of the last of the cascaded delay cells,
wherein each of the cascaded delay cells is comprised of a first plurality of sub-cells connected in parallel with each other and a second plurality of sub-cells connected in parallel with each other, wherein the first plurality of sub-cells configured to have a delay that is variable as a function of the variable control signal and the second plurality of the sub-cells configured to have a delay that is set by the fixed control signal.

2. A ring oscillator as recited in claim 1, wherein the variable control signal causes a frequency of the output signal to change as a function of the variable control signal.

3. A ring oscillator as recited in claim 2, wherein a ratio between the variable control signal and the frequency of the output signal is a function of the number of sub-cells that receive the fixed control signal.

4. A ring oscillator as recited in claim 1, wherein each of the first and second pluralities of sub-cells in each cascaded delay cell has an input terminal and an output terminal, and wherein each of the first and second pluralities of sub-cells in each cascaded delay cell are connected in parallel by connecting the input terminals to each other and the output terminals to each other.

5. A ring oscillator as recited in claim 1 wherein a frequency offset of the output signal is a function of the sub-cells that receive the fixed and variable control signal sets.

6. A ring oscillator as recited in claim 2, wherein the control circuit is further configured for activating sub-cells to change a frequency range in which the output signal changes as a function of the variable control signal.

7. A ring oscillator as recited in claim 1 wherein each of the first and second pluralities of sub-cells includes a single ended or differential delay cell.

8. A ring oscillator as recited in claim 1, wherein the control circuit selects the sub-cells that will receive the variable control signal, the sub-cells to receive the fixed control signal, and the sub-cells to be activated to program an output frequency of the ring oscillator.

9. In a ring oscillator, a device comprising:
a number of cascaded delay cells being controlled by a variable control signal and a fixed control signal, each delay cell having an input connected to receive an input signal which, except for the first of the cascaded delay cells, corresponds to an output signal derived from preceding delay cells, the input of the first delay cell being connected to receive the output signal of the last of the cascaded delay cells; and
a control circuit to generate the variable control signal and the fixed control signal;
wherein each of the cascaded delay cells is comprised of a first plurality of sub-cells connected in parallel with each other and a second plurality of sub-cells connected in parallel with each other, wherein each of the first plurality of sub-cells has a delay that is variable as a function of the variable control signal and each of the second plurality of sub-cells has a delay that is set by the fixed control signal.

10. A device as recited in claim 9, wherein the variable control signal causes a frequency of the output signal to change as a function of a level of the variable control signal.

11. A device as recited in claim 10, wherein a ratio between a level of the variable control signal and the frequency of the output signal is a function of the number of sub-cells that receive the fixed control signal.

12. A device as recited in claim 11, wherein the control circuit is configured for activating and deactivating sub-cells in each of the cascaded delay cells to increase or decrease a minimum and maximum frequency of the output signal.

13. A device as recited in claim 12, wherein each sub-cell is operative to receive signals from the control circuit that are distributed to sub-cells to program a frequency of the ring oscillator, said signals comprise:

the variable control signal;

the fixed control signal, and a signal indicating if the sub-cell is to be activated or deactivated.

14. A device as recited in claim 9, wherein each of the first and second pluralities of sub-cells in each cascaded delay cell has a common input terminal and a common output terminal, and wherein each of the first and second pluralities of sub-cells in each cascaded delay cell are connected in parallel by connecting the input terminals to each other and the output terminals to each other.

15. A method comprising:

cascading a number of delay cells that are each comprised of a first plurality of sub-cells connected in parallel with each other and a second plurality of sub-cells connected in parallel with each other;

controlling the delay cells with a variable control signal and a fixed control signal provided from a control circuit;

supplying an input signal to an input of each delay cell which, except for the first of the cascaded delay cells, corresponds to an output signal derived from a preceding delay cells;

supplying an output signal of the last of the cascaded delay cells to the input of the first delay cell;

setting the delay of the first plurality of sub-cells in each of the cascaded delay cells to be a function of the variable control signal; and setting the delay of the second plurality of sub-cells in each of the cascaded delay cells with the fixed control signal.

16. A method as recited in claim 15, further comprising causing a frequency of an output signal to change by continuously changing a level of the variable control signal.

17. A method as recited in claim 15, wherein a ratio between the variable control signal and a frequency of an output signal is a function of the number of sub-cells that receive the fixed control signal.

18. A method as recited in claim 16, further comprising setting gains of the first and second pluralities of sub-cells so that consecutive multiple frequency ranges can be selected by changing the level of the variable control signal and turning off or on some of the first and second pluralities of sub-cells that receive the variable control signal.

19. A method as recited in claim 16, further comprising activating sub-cells to change the minimum frequency and maximum frequency range in which the output signal changes as a function of the variable control signal.

20. A method as recited in claim 15, further comprising:

cascading the delay cells to form a ring oscillator, and selectively transmitting to each delay cell signals from the control circuit that programs the frequency of the ring oscillator, said signals comprising the variable control signal, the fixed control signal, and an indication of which sub-cells are to be activated.

* * * * *